(12) United States Patent
Cho et al.

(10) Patent No.: US 7,858,476 B2
(45) Date of Patent: Dec. 28, 2010

(54) METHOD FOR FABRICATING SEMICONDUCTOR DEVICE WITH RECESS GATE

(75) Inventors: Yong-Tae Cho, Ichon (KR); Suk-Ki Kim, Ichon (KR); Sang-Hoon Cho, Ichon (KR)

(73) Assignee: Hynix Semiconductor Inc., Ichon-Shi, Kyoungki-Do (KR)

( * ) Notice: Subject to any disclaimer, the term of this patent is extended or adjusted under 35 U.S.C. 154(b) by 159 days.

(21) Appl. No.: 11/928,056

(22) Filed: Oct. 30, 2007

(65) Prior Publication Data
US 2008/0102639 A1    May 1, 2008

(30) Foreign Application Priority Data
Oct. 30, 2006    (KR) .................. 10-2006-0105458
Jan. 31, 2007    (KR) .................. 10-2007-0009862

(51) Int. Cl.
*H01L 21/336* (2006.01)
(52) U.S. Cl. .................. 438/270; 438/259; 438/589; 257/E21.549
(58) Field of Classification Search .............. 257/396, 257/E29.2, E29.321, E21.546, E21.618, E21.624, 257/68, 71, E27.091, E21.651, E21.655, 257/E21.549, E21.654, E27.092; 438/259, 438/270, 272, 430, 589, 695, 696, 700, 765, 438/FOR. 125, FOR. 197, 68, 71, E27.091, 438/E27.092, E21.651, E21.655, 702, 243, 438/386, 244
See application file for complete search history.

(56) References Cited

U.S. PATENT DOCUMENTS

| | | | | |
|---|---|---|---|---|
| 4,763,179 A | * | 8/1988 | Tsubouchi et al. .......... 257/301 |
| 5,348,616 A | * | 9/1994 | Hartman et al. ............... 216/48 |
| 6,376,383 B2 | * | 4/2002 | Mitsuiki ..................... 438/706 |
| 6,521,524 B1 | * | 2/2003 | Wang et al. ................. 438/637 |
| 6,521,538 B2 | * | 2/2003 | Soga et al. .................. 438/695 |
| 6,524,944 B1 | * | 2/2003 | Rangarajan et al. ......... 438/623 |
| 6,544,838 B2 | * | 4/2003 | Ranade et al. .............. 438/244 |
| 6,693,006 B2 | * | 2/2004 | Ho et al. ..................... 438/243 |
| 6,833,079 B1 | * | 12/2004 | Giordani ........................ 216/2 |
| 6,905,944 B2 | * | 6/2005 | Chudzik et al. ............. 438/435 |
| 6,919,640 B2 | * | 7/2005 | Jeon et al. ................... 257/775 |

(Continued)

FOREIGN PATENT DOCUMENTS

CN    1224234    7/1999

(Continued)

OTHER PUBLICATIONS

Quirk et al., "Semiconductor Manufacturing Technology", Prentice Hall, 2001, pp. 450.*

(Continued)

*Primary Examiner*—Matthew C Landau
*Assistant Examiner*—Joseph C Nicely
(74) *Attorney, Agent, or Firm*—Lowe Hauptman Ham & Berner LLP

(57) ABSTRACT

A method for fabricating a semiconductor device includes forming a hard mask pattern over a substrate, forming a first recess in the substrate and a passivation layer on sidewalls of the first recess using the hard mask pattern as an etch barrier, and forming a second recess by etching a bottom portion of the first recess using the passivation layer as an etch barrier, wherein a width of the second recess is greater than that of the first recess.

12 Claims, 12 Drawing Sheets

U.S. PATENT DOCUMENTS

| | | | |
|---|---|---|---|
| 6,979,652 B2* | 12/2005 | Khan et al. | 438/700 |
| 7,314,792 B2* | 1/2008 | Kim et al. | 438/225 |
| 7,345,338 B1* | 3/2008 | Han et al. | 257/330 |
| 7,462,562 B2* | 12/2008 | Fujita | 438/700 |
| 7,485,557 B2* | 2/2009 | Han et al. | 438/589 |
| 7,507,651 B2* | 3/2009 | Cho et al. | 438/585 |
| 7,553,767 B2* | 6/2009 | Cho et al. | 438/689 |
| 2001/0023956 A1* | 9/2001 | Collins et al. | 257/301 |
| 2001/0023960 A1* | 9/2001 | Soga et al. | 257/330 |
| 2002/0094690 A1* | 7/2002 | Athavale et al. | 438/710 |
| 2003/0129825 A1* | 7/2003 | Yoon | 438/626 |
| 2004/0086787 A1* | 5/2004 | Waheed et al. | 430/5 |
| 2005/0001252 A1 | 1/2005 | Kim et al. | |
| 2005/0066994 A1* | 3/2005 | Biles et al. | 134/1.1 |
| 2005/0266691 A1* | 12/2005 | Gu et al. | 438/706 |
| 2006/0032833 A1* | 2/2006 | Kawaguchi et al. | 216/37 |
| 2006/0113590 A1* | 6/2006 | Kim et al. | 257/330 |
| 2006/0150914 A1* | 7/2006 | Yamamoto et al. | 118/723 MW |
| 2006/0160351 A1* | 7/2006 | Ahn | 438/618 |
| 2006/0237817 A1* | 10/2006 | Park | 257/500 |
| 2006/0267085 A1* | 11/2006 | Matsuura | 257/330 |
| 2006/0289931 A1* | 12/2006 | Kim et al. | 257/330 |
| 2007/0020861 A1* | 1/2007 | Chong et al. | 438/296 |
| 2007/0054505 A1* | 3/2007 | Antonelli et al. | 438/789 |
| 2007/0059897 A1* | 3/2007 | Tilke et al. | 438/424 |
| 2007/0087520 A1* | 4/2007 | Mitsuiki et al. | 438/424 |
| 2007/0087521 A1* | 4/2007 | Fujita | 438/424 |
| 2007/0099383 A1* | 5/2007 | Han et al. | 438/270 |
| 2007/0099384 A1* | 5/2007 | Han et al. | 438/270 |
| 2007/0105388 A1* | 5/2007 | Lee et al. | 438/710 |
| 2007/0111469 A1* | 5/2007 | Kim et al. | 438/424 |
| 2007/0123014 A1* | 5/2007 | Han et al. | 438/585 |
| 2007/0131652 A1* | 6/2007 | Okune et al. | 216/67 |
| 2007/0148934 A1* | 6/2007 | Cho et al. | 438/585 |
| 2007/0155101 A1* | 7/2007 | Lee et al. | 438/259 |
| 2007/0224762 A1* | 9/2007 | Lee | 438/259 |
| 2007/0224763 A1* | 9/2007 | Fujimoto et al. | 438/259 |
| 2007/0238295 A1* | 10/2007 | Alapati et al. | 438/689 |
| 2007/0249172 A1* | 10/2007 | Huang et al. | 438/711 |
| 2007/0254465 A1* | 11/2007 | Jung | 438/589 |
| 2008/0038673 A1* | 2/2008 | Nagaiwa et al. | 430/313 |
| 2008/0081449 A1* | 4/2008 | Cho et al. | 438/589 |
| 2008/0087948 A1* | 4/2008 | Kim | 257/330 |
| 2008/0102624 A1* | 5/2008 | Cho et al. | 438/639 |
| 2008/0132074 A1* | 6/2008 | Kim | 438/700 |
| 2008/0146029 A1* | 6/2008 | Baks et al. | 438/671 |
| 2008/0157194 A1* | 7/2008 | Lee et al. | 257/334 |
| 2008/0160742 A1* | 7/2008 | Cho et al. | 438/589 |
| 2009/0025876 A1* | 1/2009 | Magni | 156/345.27 |
| 2009/0045482 A1* | 2/2009 | Liaw et al. | 257/510 |
| 2009/0121309 A1* | 5/2009 | Kim | 257/506 |

FOREIGN PATENT DOCUMENTS

| | | |
|---|---|---|
| CN | 1784768 | 6/2006 |
| JP | 2001-244325 | 9/2001 |
| KR | 1020000006567 | 1/2000 |
| KR | 1020060114180 | 11/2006 |

OTHER PUBLICATIONS

Office Action for Korean Application 10-2007-0009862.
Office Action for Korean Application 10-2006-0105458.
Notice of Allowance for Korean patent application 10-2007-0009862.
Chinese Office Action for Chinese Application No. 200710181598.9.
Office Action for Korean Application 10/2006/0105458.

* cited by examiner

METHOD FOR FABRICATING SEMICONDUCTOR DEVICE WITH RECESS GATE

CROSS-REFERENCE TO RELATED APPLICATIONS

The present invention claims priority of Korean patent application numbers 10-2006-0105458 and 10-2007-0009862, respectively filed on Oct. 30, 2006 and Jan. 31, 2007, which are incorporated by reference in their entirety.

BACKGROUND OF THE INVENTION

1. Field of the Invention

The present invention relates to a method for fabricating a semiconductor device, and more particularly, to a method for fabricating a semiconductor device including a recess gate.

2. Description of Related Art

As semiconductor devices become highly integrated, a channel length of a cell transistor decreases. Furthermore, as an ion implantation doping concentration to a substrate increases, junction leakage also increases due to an increasing electric field. Thus, it may be difficult to secure a refresh characteristic of a semiconductor device with a typical planar type transistor structure.

Thus, a three-dimensional recess gate process is introduced to overcome the above limitations. According to the process, a portion of an active region in a substrate is etched to form a recess and a gate is formed over the recess. Thus, the channel length of the cell transistor increases and the ion implantation doping concentration to the substrate decreases, improving the refresh characteristic of the semiconductor device.

FIG. 1 illustrates a cross-sectional view of a method for fabricating a transistor including a typical recess gate. An isolation layer 12 is formed in a substrate 11 to define an active region. An oxide pattern 13 and a hard mask pattern 14 are formed over the substrate 11. The substrate 11 is partially etched using the hard mask pattern 14 as an etch mask to form recess regions having a vertical profile.

However, recently, as a semiconductor device becomes more highly integrated, a channel length of a cell transistor further decreases. Therefore, during employing the conventional method to form a recess region, the recess region may be formed with a V-shape profile. As a result, a horn may be formed on a substrate between an isolation layer and the recess region. That is, according to the conventional method employing a shallow trench isolation (STI) process for forming the isolation layer, the STI has an angle less than 90 degree in order for an insulation layer to gap-fill the trench. Meanwhile, the recess region has the V-shape profile because a pattern size decreases. Consequently, a large amount of residual silicon remains on the substrate after formation of the isolation layer and the recess region, forming the horn.

FIG. 2 illustrates a micrographic view of a profile of a typical recess pattern. The recess pattern has a V-shape profile and a horn A is generated on an interface between an isolation layer and a recess region. Since the recess pattern has the V-shape profile, the degree of residual silicon is large and thus, a height of the horn A is very high. Since the horn becomes a stress point causing a leakage current, a refresh characteristic and a production yield of the semiconductor device may be deteriorated.

SUMMARY OF THE INVENTION

The present invention is directed to provide a method for fabricating a semiconductor device, and more particularly, to a method for fabricating a recess gate in a semiconductor device, which can decrease a height of a horn on an interface between an isolation layer and a recess region by forming a recess having a dual profile providing different upper and lower profiles of the recess through an etching process performed in two steps.

In accordance with an aspect of the present invention, there is provided a method for fabricating a semiconductor device, including: forming a hard mask pattern over a substrate; forming a first recess in the substrate and a passivation layer on sidewalls of the first recess using the hard mask pattern as an etch barrier; and forming a second recess by etching a bottom portion of the first recess using the passivation layer as an etch barrier, wherein a width of the second recess is greater than that of the first recess.

DESCRIPTION OF SPECIFIC EMBODIMENTS

The present invention relates to a method for fabricating a transistor with a recess gate in a semiconductor device. According to embodiments of the present invention, a refresh characteristic of the semiconductor device and a production yield may be improved as a height of a horn on an interface between an isolation layer and a recess region is reduced by forming a recess region having a dual profile providing different profiles to an upper portion and a lower portion of the recess region.

FIGS. 3A to 3E illustrate cross-sectional views of a method for fabricating a transistor with a recess gate in accordance with a first embodiment of the present invention.

Figure 3A:
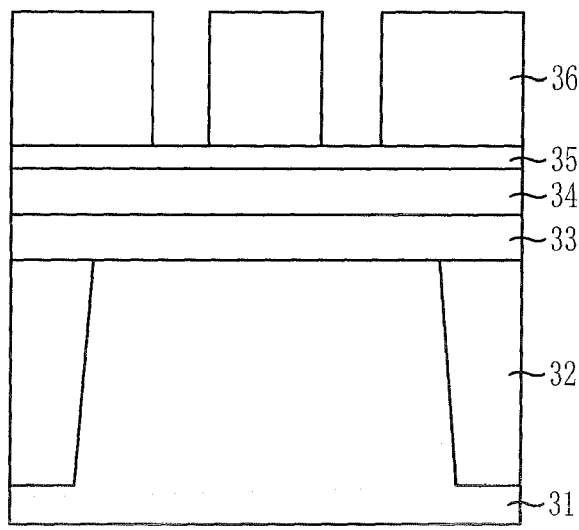
FIGS. 3A to 3E illustrate cross-sectional views of a method for fabricating a transistor with a recess gate in accordance with a first embodiment of the present invention.

Referring to FIG. 3A, an isolation layer 32 is formed in a substrate 31 to define an active region. The isolation layer 32 may be formed using a shallow trench isolation (STI) process. A first hard mask layer 33 and a second hard mask layer 34 are sequentially formed over the substrate 31 having the isolation layer 32. The first hard mask layer 33 includes an oxide layer and the second hard mask layer 34 includes an amorphous carbon layer. The oxide layer 33 is used as an etch barrier during a subsequent process for forming a recess region. A photoresist pattern 36 opening a recess target region is formed over the amorphous carbon layer 34. For another embodiment, an anti-reflection layer 35 for preventing a reflection during a photo-exposure process may be formed on the amorphous carbon layer 34 before forming the photoresist pattern 36.

Figure 3B:
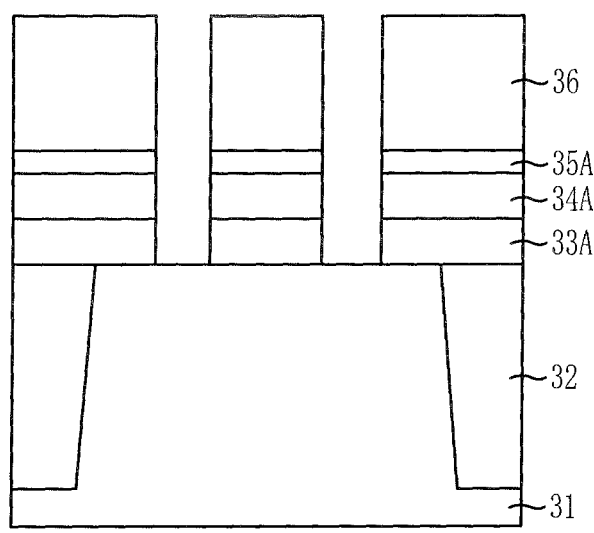

Referring to FIG. 3B, the anti-reflection layer 35, the amorphous carbon layer 34 and the oxide layer 33 are sequentially etched using the photoresist pattern 36 as an etch mask. Etching of the amorphous carbon layer 34 is performed to expose the oxide layer 33 by using a magnetically enhanced reactive ion etching (MERIE) as a plasma source and a gas mixture of nitrogen ($N_2$) and oxygen ($O_2$) gases. Etching of the oxide layer 33 is performed to expose the substrate 31 using a gas mixture of $CF_X$, $CHF_X$ and $O_2$ gases. Reference numerals 33A, 34A and 35A represent an oxide pattern, an amorphous carbon pattern and an anti-reflection pattern, respectively, which are formed by partially etching the oxide layer 33, the amorphous carbon layer 34 and the anti-reflection layer 35.

Figure 3C:
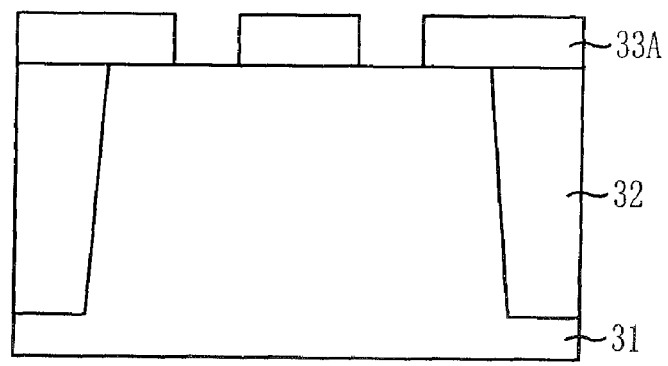

Then, the photoresist pattern 36 and the anti-reflection pattern 35A are removed and the amorphous carbon pattern 34A is additionally removed. The amorphous carbon pattern 34A may be removed merely using $O_2$ plasma, wherein a flow rate of the $O_2$ plasma ranges from approximately 200 sccm to approximately 1,000 sccm. Furthermore, the amorphous carbon pattern 34A may be removed with merely supplying a source power without supplying a bias power. Thus, the oxide pattern 33A only remains as shown in FIG. 3C.

Figure 3D:
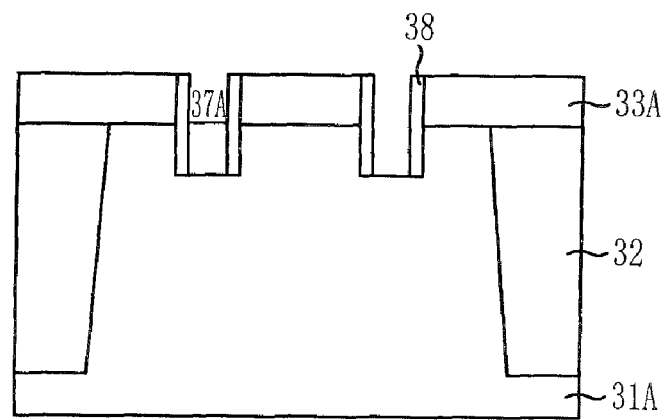

Referring to FIG. 3D, a first etching is performed on the substrate 31 to form a first recess 37A using the oxide pattern 33A as an etch barrier. The first etching for forming the first recess 37A is performed using a TCP/ICP (transformer coupled plasma/inductively coupled plasma) as a plasma source and using a gas mixture of a hydrobrom (HBr) gas as a main etching gas and a $CF_XH_X$ gas. Furthermore, the first etching is performed at a pressure ranging from approximately 5 mTorr to approximately 20 mTorr, at a source power ranging from approximately 700 W to approximately 1,500 W and at a bias power ranging from approximately 200 V to approximately 500 V. The first recess 37A has a vertical profile and has a depth ranging from approximately 200 Å to approximately 500 Å. A reference numeral 31A represents a first patterned substrate having the first recess 37A.

While the first etching is performed to form the first recess 37A, polymers are generated as an etch resultant by the $CF_XH_X$ gas on an etched surface, especially on sidewalls of the first recess 37A. The polymers form a passivation layer 38 that acts as an etch barrier during a subsequent process for forming a second recess. A large amount of polymers may be generated by using an etching gas containing the $CF_XH_X$ gas. When the $CF_XH_X$ gas is added during the etching process for forming the first recess 37A and the passivation layer 38, the $CF_XH_X$ gas preferably includes trifluoromethane ($CHF_3$) or difluoromethane ($CH_2F_2$).

Figure 3E:
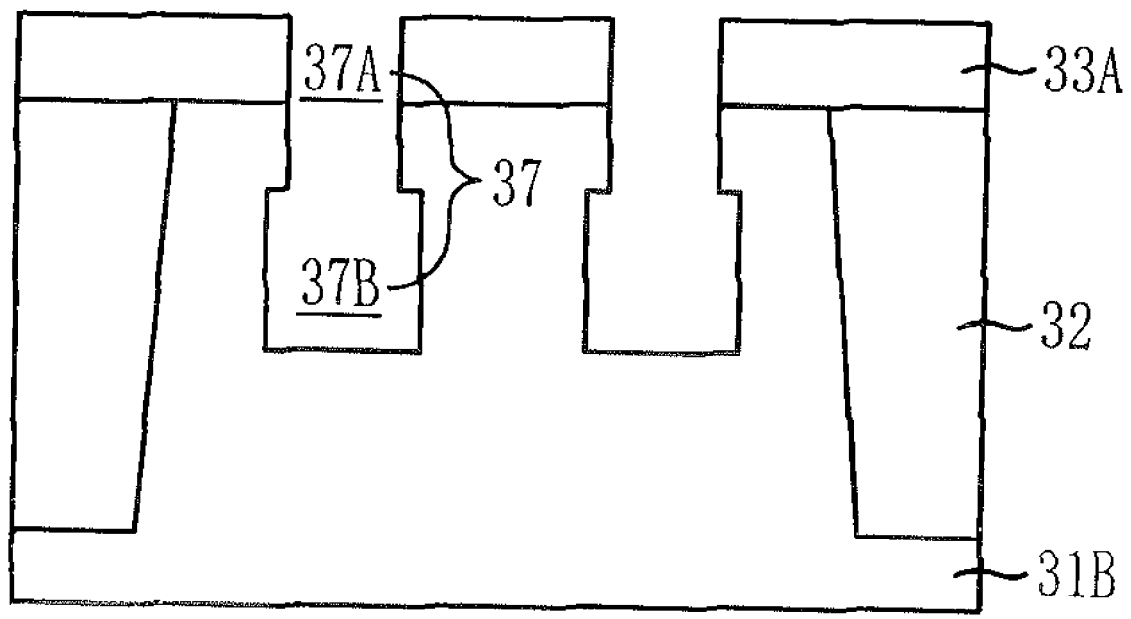

Referring to FIG. 3E, a second etching is performed on the first patterned substrate 31A using the oxide pattern 33A and the passivation layer 38, thereby forming a second recess 37B. The first etching and the second etching may be performed in-situ. A reference numeral 31B represents a second patterned substrate having the first recess 37A and the second recess 37B.

The second etching is performed to form the second recess 37B using TCP/ICP as a plasma source and using a gas mixture of a chloric gas and a bromic gas. It is preferable that the second etching is performed at a pressure ranging from approximately 10 mTorr to approximately 30 mTorr, at a source power ranging from approximately 500 W to approximately 1,000 W and at a bias power ranging from approximately 200 V to approximately 500 V. Especially, when a chlorine ($Cl_2$) gas as the chloric gas and a hydrobromic (HBr) gas as the bromic gas are used, a flow ratio of HBr to $Cl_2$ preferably ranges from approximately 0.5:1 to approximately 2:1. When performing the second etching on the first patterned substrate 31A under the afore-mentioned circumstances, the second etching may be performed to provide a slight isotropic etching characteristic. Thus, the second recess 37B has a bowing profile having incurved sidewalls and has a depth ranging from approximately 700 Å to approximately 1,000 Å.

The first recess 37A and the second recess 37B form a recess region 37 having a dual profile. That is, a profile of an upper portion of the recess region 37 is different from that of a lower portion of the recess region 37. The recess region 37 with the dual profile has the lower portion whose width is tens of nanometers wider than that of a typical recess. A third etching (not shown) is performed on the second patterned substrate 31B to additionally increase the width of the second recess 37B using the oxide pattern 33A and the passivation layer 38 as an etch barrier after forming the second recess 37B. Therefore, the sidewalls of the second recess 37B may be extended.

The third etching to extend the sidewalls of the second recess 37B is performed using TCP/ICP as a plasma source, a gas mixture of HBr and $Cl_2$ and an additional gas mixture of sulphur hexafluoride ($SF_6$) and $O_2$. The third etching is performed at a pressure ranging from approximately 20 mTorr to approximately 100 mTorr, at a source power ranging from approximately 500 W to approximately 1,500 W and at a bias power of less than 50 V. Furthermore, a $NF_X$ or $CF_X$ gas may be used instead of $SF_6$ gas.

When the third etching on the second patterned substrate 31B is performed under the afore-mentioned circumstances, the third etching may be performed to provide an isotropic etching characteristic. Thus, the width of the second recess 37B may be increased as much as approximately 10 nm to approximately 15 nm. Therefore, a size of a horn may be much reduced by additionally performing the third etching. Then, the oxide pattern 33A is removed and a process for forming a recess gate pattern (not shown) is performed on the recess region 37. Thus, the method for fabricating the semiconductor device with the recess gate in accordance with the first embodiment of the present invention is finished.

Although the first, second, and additional third etching in accordance with the first embodiment of present invention is performed in a high density etching apparatus using TCP/ICP as a plasma source, the other embodiments of the present invention may exist. For instance, the first, second, and additional third etching may be performed in an ICP type etching apparatus equipped with a faraday shield or in an etching apparatus using a microwave down stream (MDS) type, an electron cyclotron resonance (ECR) type or a helical type plasma source.

Figure 1:
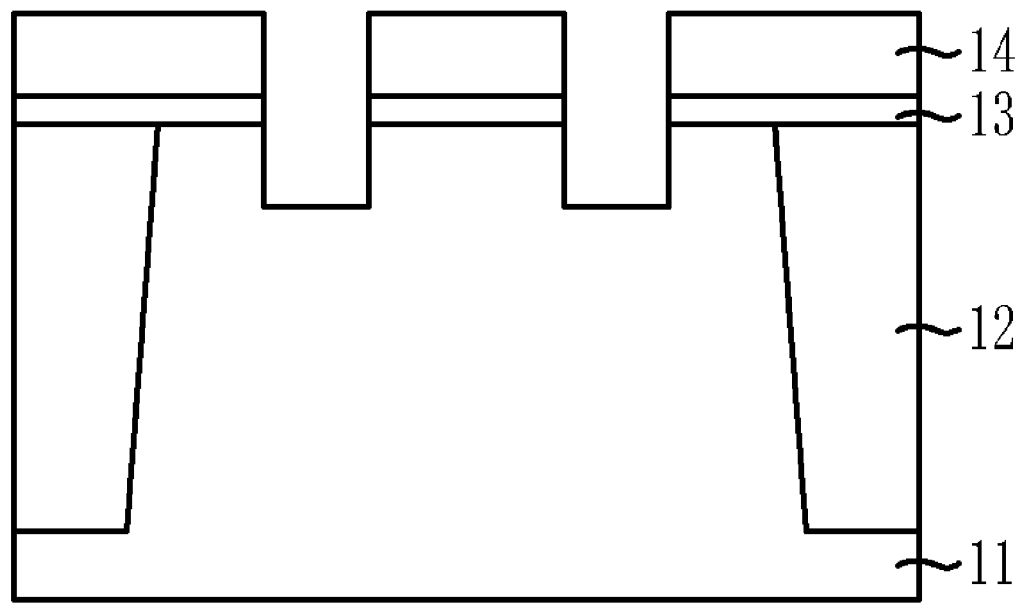
FIG. 1 illustrates a cross-sectional view of a method for fabricating a transistor with a conventional recess gate.
Figure 2:
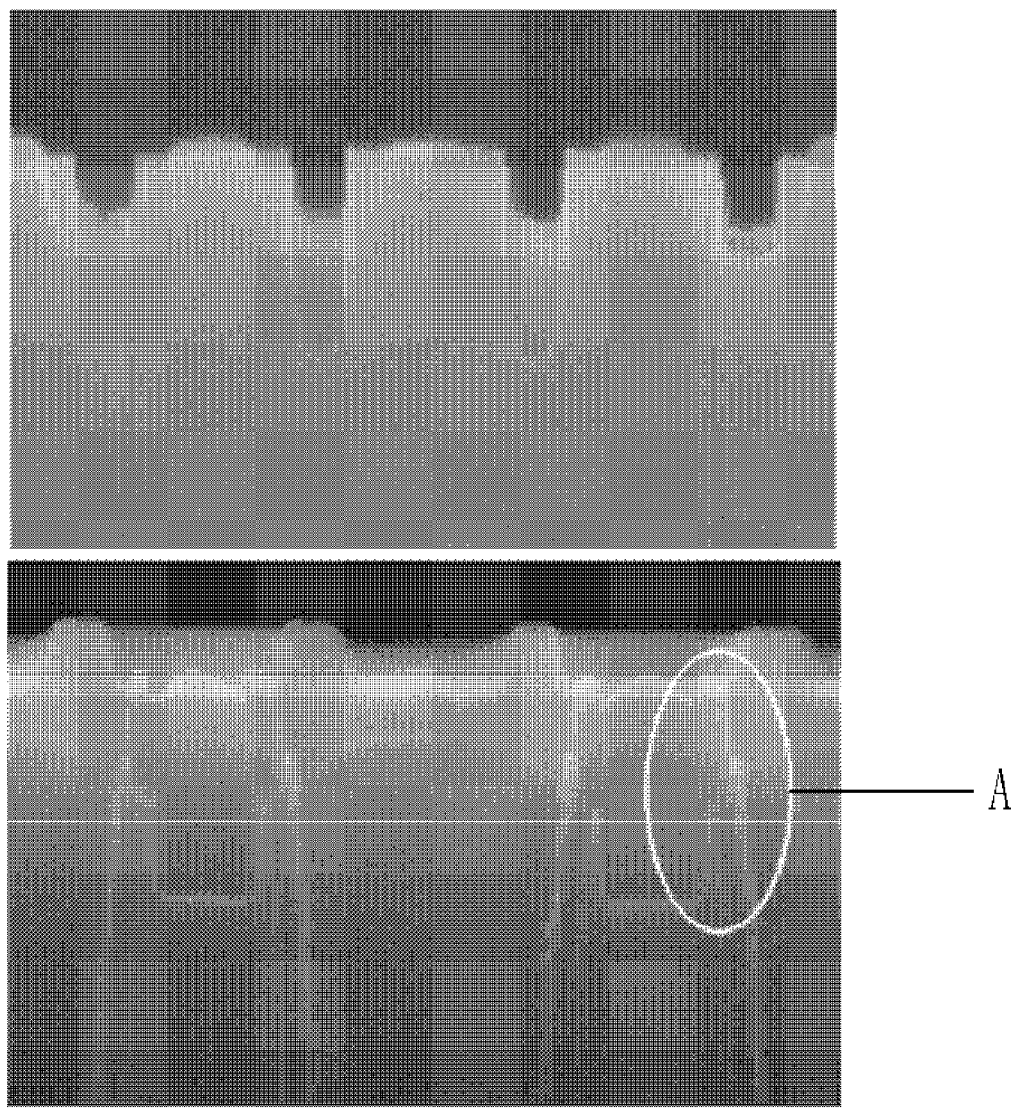
FIG. 2 illustrates a micrographic view of a profile of the conventional recess gate.
Figure 4:
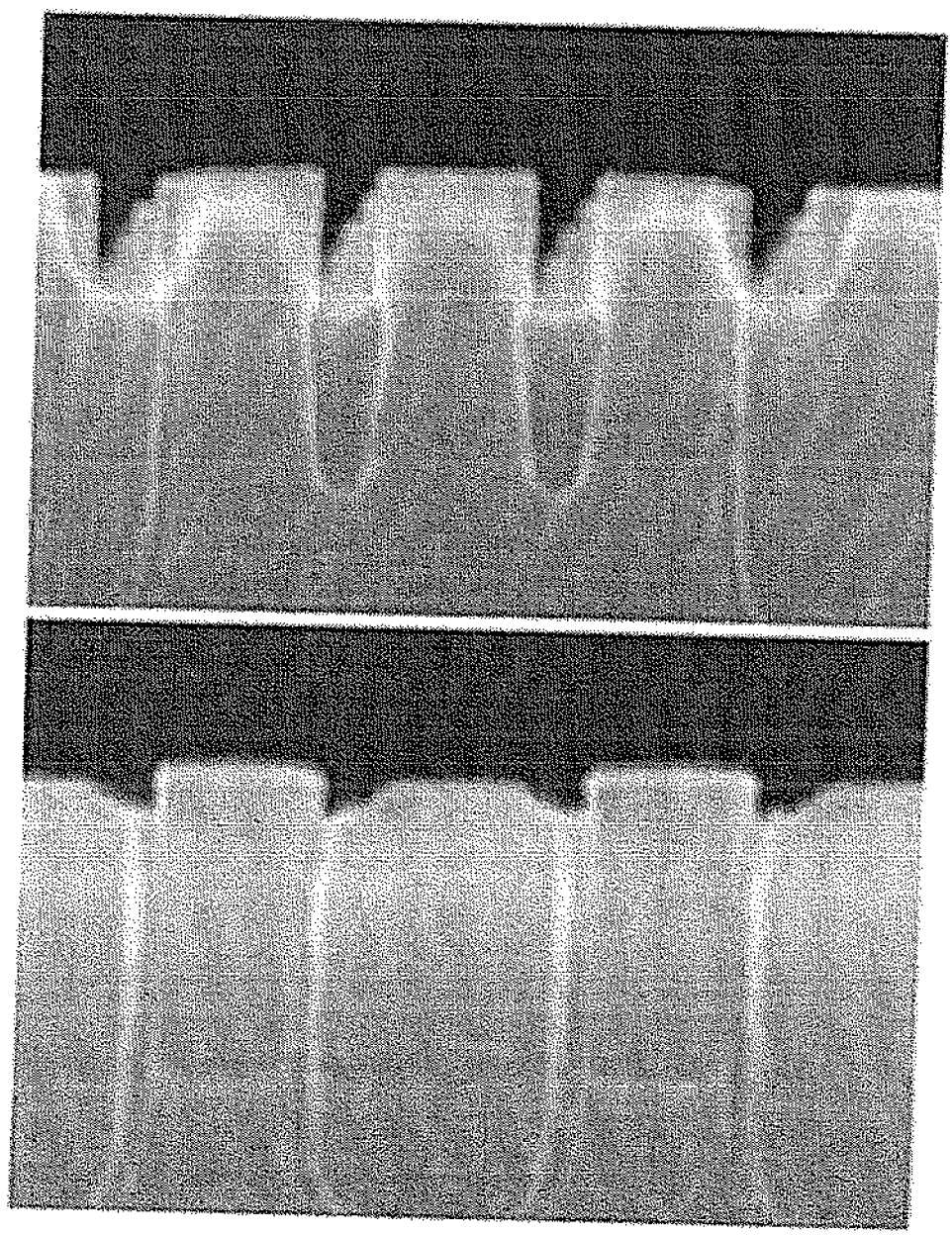
FIG. 4 illustrates a micrographic view of a profile of the recess gate in accordance with the first embodiment of the present invention.

FIG. 4 illustrates a micrographic view of a profile of the recess region 37 in accordance with the first embodiment of the present invention. The size of the horn is remarkably smaller than the size of the horn in the typical recess (refer to FIG. 2), and the recess region 37 has the dual profile instead of the V-shape profile of the typical recess region. Therefore, although a STI angle is less than 90 degree, the size of the horn may be minimized. A refresh characteristic of a semiconductor device may be improved as the recess region 37 may control a leakage current. As a result, a production yield can be enhanced and a production cost can be reduced.

FIGS. 5A to 5E illustrate cross-sectional views of a method for fabricating a transistor with a recess gate in accordance with a second embodiment of the present invention.

Figure 5A:
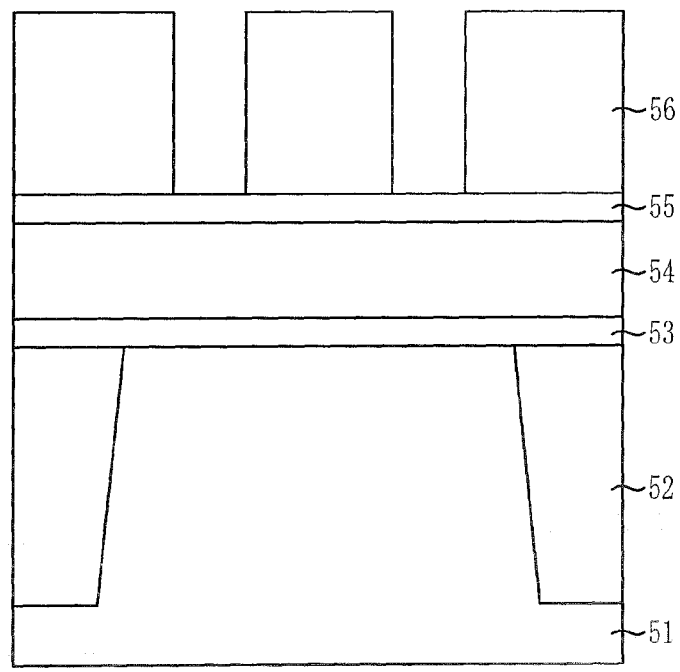
FIGS. 5A to 5F and FIG. 8 illustrate cross-sectional views of a method for fabricating a transistor with a recess gate in accordance with a second embodiment of the present invention.

Referring to FIG. 5A, an isolation layer 52 is formed in a substrate 51 to define an active region. The isolation layer 52 may be formed using a shallow trench isolation (STI) process. A first hard mask layer 53 and a second hard mask layer 54 are sequentially formed over the substrate 51 having the isolation layer 52. The first hard mask layer 53 includes an oxide layer and the second hard mask layer 54 includes an amorphous carbon layer. The oxide layer 53 is used as an etch barrier during a subsequent process for forming a recess region. A photoresist pattern 56 opening a recess target region is formed over the amorphous carbon layer 54. For another embodiment, an anti-reflection layer 55 for preventing a reflection during a photo-exposure process may be formed on the amorphous carbon layer 54 before forming the photoresist pattern 56.

Figure 5B:
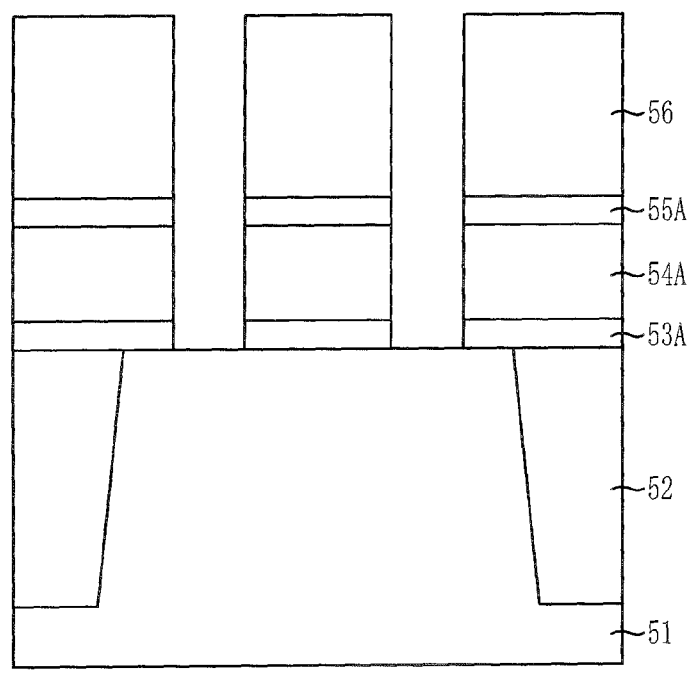

Referring to FIG. 5B, the anti-reflection layer 55 and the amorphous carbon layer 54 are sequentially etched using the photoresist pattern 56 as an etch mask. Etching of the amorphous carbon layer 54 is performed using the oxide layer 53 as an etch stop layer and is performed by using a capacitively coupled plasma (CCP) or magnetically enhanced reactive ion etching (MERIE) type plasma source and using a nitrogen ($N_2$) and oxygen ($O_2$) plasma as an etching gas. Etching of the oxide layer 53 is performed to expose the substrate 51 using the photoresist pattern 56 and an amorphous carbon pattern 54A as an etch barrier. Etching of the oxide layer 53 may be performed by using a plasma mixture of $CF_X$, $CHF_X$ and $O_2$ gases. Reference numerals 53A and 55A represent an oxide pattern and an anti-reflection pattern, respectively, which are formed by partially etching the oxide layer 53 and the anti-reflection layer 55.

Figure 5C:
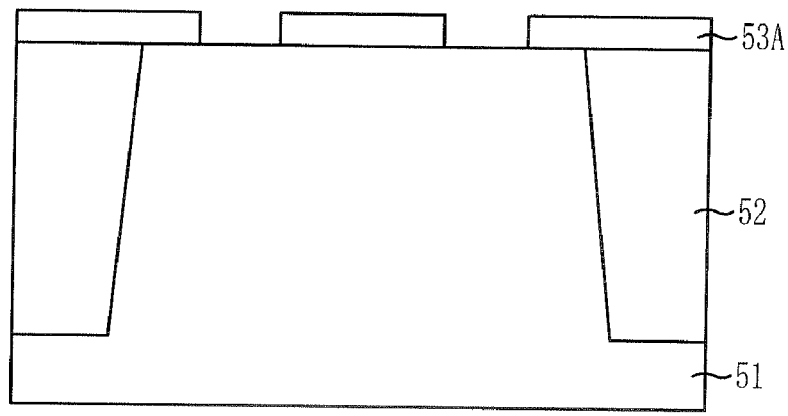

Then, the photoresist pattern 56 and the anti-reflection pattern 55A are removed (not shown) and the amorphous carbon pattern 54A is additionally removed (not shown). The amorphous carbon pattern 54A may be removed merely using $O_2$ plasma, wherein a flow rate of the $O_2$ plasma ranges from approximately 200 sccm to approximately 1,000 sccm. Furthermore, the amorphous carbon pattern 54A may be removed with merely supplying a source power without supplying a bias power. Thus, the oxide pattern 53A only remains as shown in FIG. 5C.

Figure 5D:
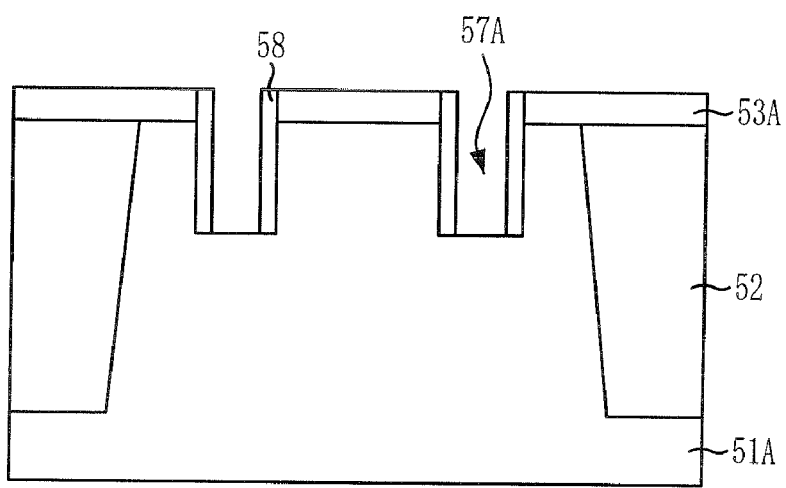

Referring to FIG. 5D, a first etching is performed on the substrate 51 to form a first recess 57A using the oxide pattern 53A as an etch barrier, thereby forming the first recess 57A having a substantially vertical profile. The first recess 57A has a depth ranging from approximately 1,000 Å to approximately 1,300 Å. A reference numeral 51A represents a first patterned substrate having the first recess 57A.

The first etching for forming the first recess 57A is performed using a plasma mixture of a chlorine ($Cl_2$) gas and a nitrogen ($N_2$) gas as a main etching gas and a hydrogen ($H_2$) gas. The added $H_2$ gas has a flow rate ranging from approximately 30 sccm to 100 sccm. When the first etching is performed using the plasma mixture of $Cl_2$, $N_2$ and $H_2$ gases, a passivation layer 58 is formed by a plasma reaction on an exposed portion of the first etched substrate 51A, more specifically, on sidewalls of the first recess 57A during the first etching. The passivation layer 58 may protect the exposed substrate 51 during the first etching and the passivation layer 58 may help forming the first recess 57A having the vertical profile. Furthermore, the passivation layer 58 may be used as an etch barrier during forming a second recess 57B described in FIG. 5E.

The first etching for forming the first recess 57A is performed using a TCP/ICP as a plasma source. Furthermore, the first etching is performed at a pressure ranging from approximately 5 mTorr to approximately 20 mTorr, at a source power ranging from approximately 700 W to approximately 1,500 W and at a bias power ranging from approximately 200 V to approximately 500 V. When the first etching process is performed using the plasma mixture including $Cl_2$, $N_2$ and $H_2$ gases, $CF_XH_X$ gas may be added, wherein the $CF_XH_X$ gas includes trifluoromethane ($CHF_3$) or difluoromethane ($CH_2F_2$).

Figure 8:
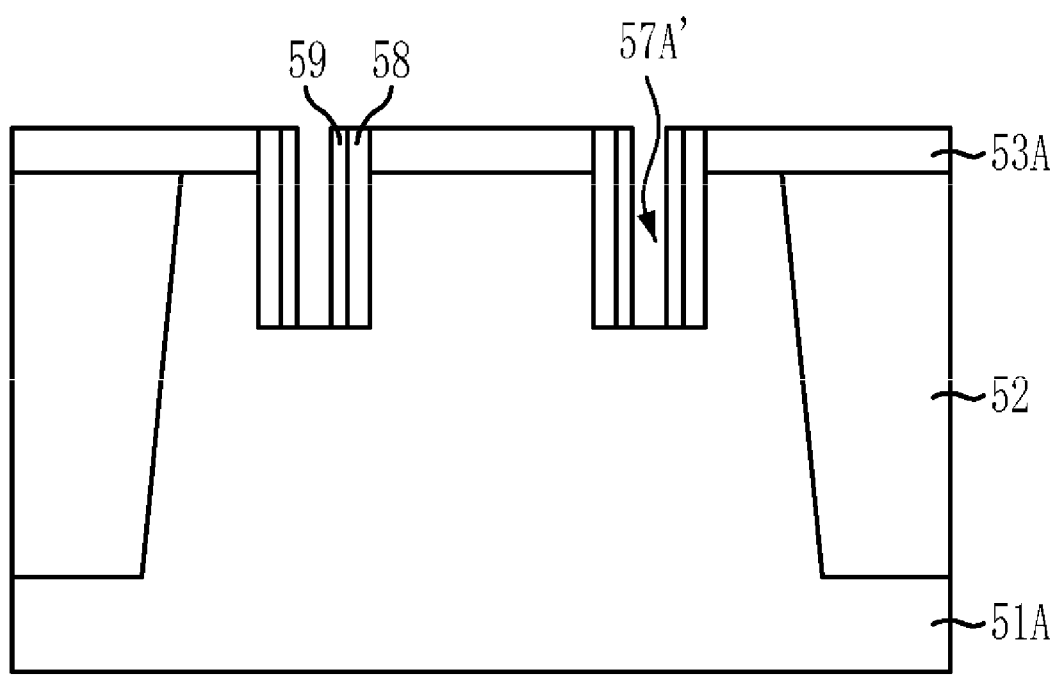

An oxide layer, shown as reference number 59 in FIG. 8, may be formed on the passivation layer 58 as a plasma oxidation process is performed on the passivation layer 58 after forming the passivation layer 58 by using O2 and N2 gases. The oxide layer is formed to provide a sufficient etch margin to the passivation layer 58 to be used as an etch barrier during a subsequent process to form the second recess 57B. It is preferable that a thickness of the oxide layer and the passivation layer 58 ranges from approximately 20 Å to approximately 30 Å. Reference number 57A' represents a second recess narrowed by the oxide layer.

Figure 5E:
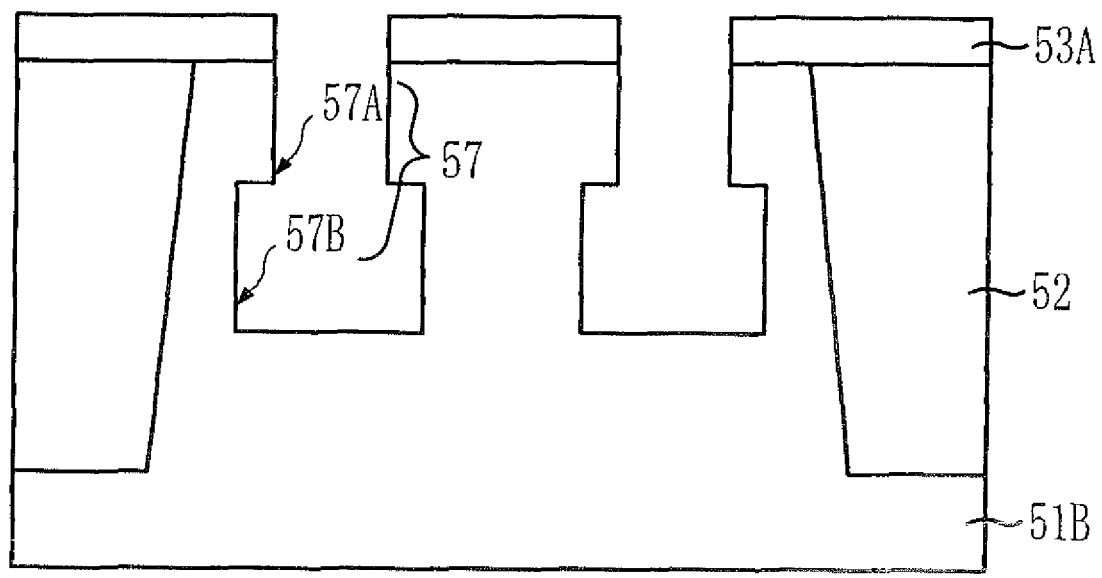

Referring to FIG. 5E, a second etching is performed on the first patterned substrate 51A using the oxide pattern 53A and the passivation layer 58 or using the oxide pattern 53A, the passivation layer 58 and the oxide layer as the etch barrier, thereby forming a second recess 57B. The second recess 57B has a depth ranging from approximately 200 Å to approximately 500 Å. A reference numeral 51B represents a second patterned substrate having the first recess 57A and the second recess 57B.

The second etching is performed to provide a slight isotropic etching characteristic and thus the second recess 57B has a bowing profile having incurved sidewalls. Therefore, the second recess 57B has a width extended as much as several nanometers to tens of nanometers than the first recess 57A.

The second etching is performed to form the second recess 57B using TPC/ICP as a plasma source and using a gas mixture of a chloric gas, a bromic and a fluoric gas. It is preferable that the second etching is performed at a pressure ranging from approximately 10 mTorr to approximately 30 mTorr, at a source power ranging from approximately 500 W to approximately 1,000 W and at a bias power ranging from approximately 100 V to approximately 500 V. The chloric gas includes a chlorine ($Cl_2$) gas, the bromic gas includes a hydrobromic (HBr) gas and the fluoric gas includes a sulphur hexafluoride ($SF_6$) gas. Especially, when a gas mixture of HBr, $Cl_2$, $SF_6$ and $O_2$ gases is used as an etching gas, a flow ratio of HBr to $Cl_2$ to $SF_6$ to $O_2$ is approximately 9:3:13:1. The afore-mentioned second etching and the first etching are performed in-situ.

The first recess 57A and the second recess 57B form a recess region 57 having a dual profile. That is, a profile of an upper portion of the recess region 57 is different from that of a lower portion of recess region 57. The recess region 57 with the dual profile has the lower portion whose width is tens of nanometers wider than that of a typical recess. Thus, a size of a horn may be minimized (refer to a right side of FIG. 7). Therefore, although an STI angle is less than 90 degree, the size of the horn may be minimized. A refresh characteristic of a semiconductor device may be improved as the recess region 57 may control a leakage current. As a result, a production yield may be enhanced and a production cost can be reduced.

Figure 5F:
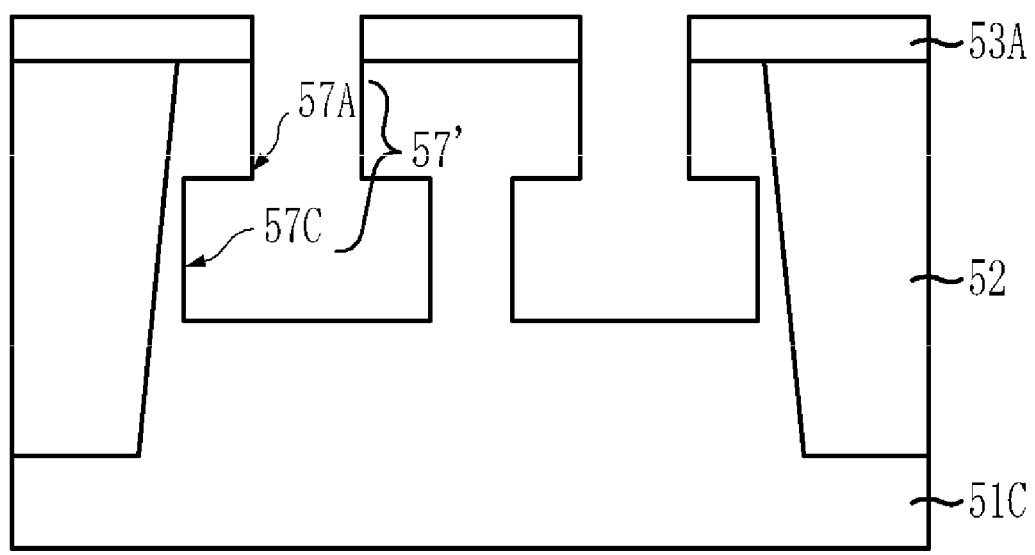

Referring to FIG. 5F, an isotropic etching (hereinafter, a third etching) is performed on the second patterned substrate 51B to additionally extend the width of the second recess 57B using the oxide pattern 53A and the passivation layer 58 as an etch barrier. Therefore, the sidewalls of the second recess 57B may be extended and accordingly the size of horn may be much reduced. Thus, the width of the second recess 57B may be increased as much as approximately 10 nm to approximately 15 nm after the third etching and a profile of the second recess 57B having a bowing profile may be changed to have an almost bulb-shape profile. Reference number 57C represents an extended second recess. The first recess 57A and the extended second recess 57C form an extended recess region 57'. Reference number 51C represents a third patterned substrate having the first recess 57A and the extended second recess 57C.

The third etching to extend the width of the second recess 57B is performed using TPC/ICP as a plasma source, a gas mixture of a large amount of HBr and $Cl_2$ gases and an additional gas mixture of a small amount of sulphur hexafluoride ($SF_6$) and $O_2$ gases. The third etching is performed at a pressure ranging from approximately 20 mTorr to approximately 100 mTorr, at a source power ranging from approximately 500 W to approximately 1,500 W and at a bias power of less than 50 V. Furthermore, $NF_X$ or $CF_X$ gases may be used instead of the $SF_6$ gas.

A gate oxide layer (not shown) is formed on the substrate (not shown) including the recess region 57 after the oxide pattern 53A is removed by a subsequent process. Then, a gate electrode (not shown) is formed over the gate oxide layer. Some portions of gate electrode fill the recess region 57 and the other portions of the gate electrode are formed over the surface of the substrate. Thus, the method for fabricating the semiconductor device with the recess gate in accordance with the second embodiment of the present invention is finished.

Although the first, second, and additional third etching in accordance with the second embodiment of present invention is performed in a high density etching apparatus using TCP/ICP as a plasma source, the other embodiments of the present invention may exist. For instance, the first, second, and additional third etching may be performed in an ICP type etching apparatus equipped with a faraday shield or in an etching apparatus using a microwave down stream (MDS) type, an electron cyclotron resonance (ECR) type or a helical type plasma source.

Figure 6:
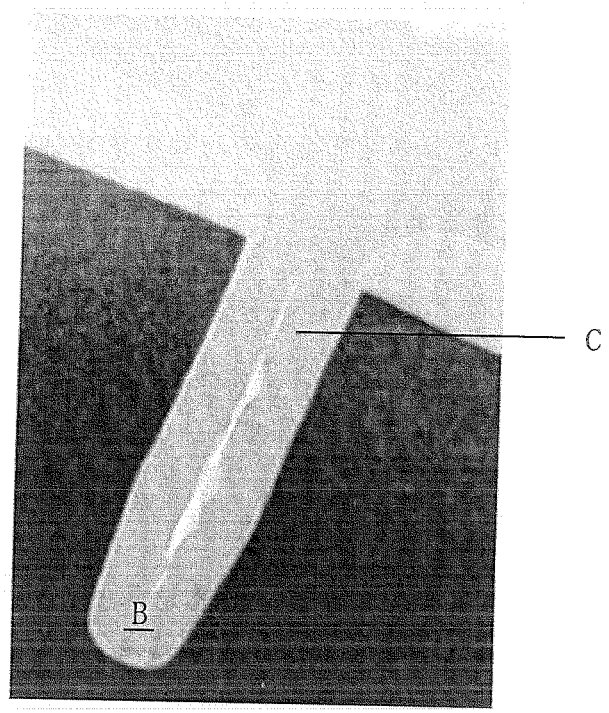
FIG. 6 illustrates a micrographic view of a profile of a passivation layer C on sidewalls of a first recess B in accordance with the second embodiment of the present invention.

FIG. 6 illustrates a micrographic view of a profile of a passivation layer C on the sidewalls of a first recess B in accordance with the second embodiment of the present invention. The passivation layer C is simultaneously formed on the sidewalls of the first recess B by a plasma reaction during etching the substrate (not shown) to form the first recess B by using the gas mixture including $Cl_2$ and $N_2$ gases and $H_2$ gas.

Figure 7:
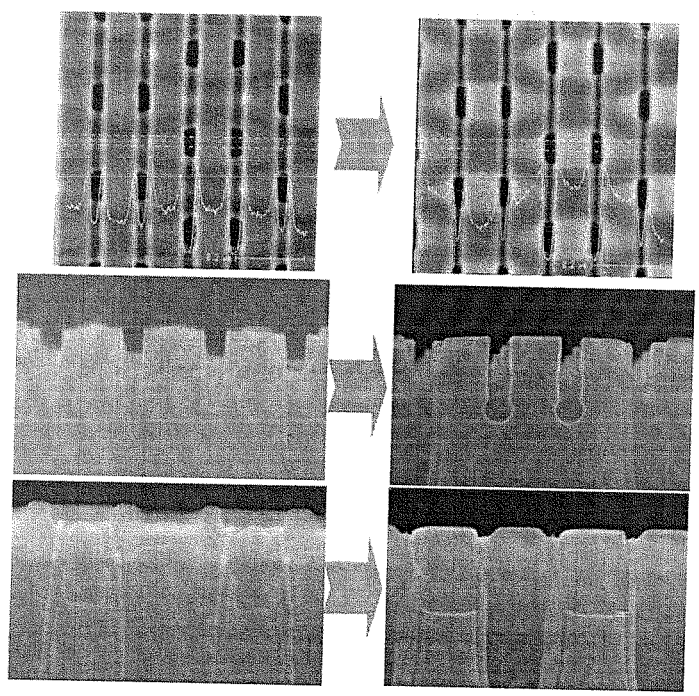
FIG. 7 illustrates micrographic views for comparing the conventional recess gate and the recess gate in accordance with the second embodiment of the present invention.

FIG. 7 illustrates micrographic views for comparing the conventional recess gate and the recess gate in accordance with the second embodiment of the present invention.

Referring to a left side of FIG. 7, a relatively high horn is generated on an interface between an isolation layer and a recess gate as the typical recess gate has a sharp bottom profile. On the other hand, a horn on a right side of FIG. 7 is remarkably smaller than that in the typical recess gate on the left side of FIG. 7 as the recess gate in accordance with the second embodiment of the present invention has a dual profile where a lower portion of the recess gate is wider than an upper portion. Thus, a size of the horn may be minimized.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:
   forming a hard mask pattern over a substrate;
   forming a first recess in the substrate and a passivation layer on sidewalls of the first recess using the hard mask pattern as an etch barrier, the first recess having a vertical profile;
   performing a second recess etching to form a second recess, the second recess etching being a slightly isotropical etching process and arranged to etch a bottom portion of the first recess using the passivation layer as an etch barrier, wherein a width of the second recess is greater than that of the first recess; and
   after forming the second recess, performing an isotropical etching to extend sidewalls of the second recess using the passivation layer as an etch barrier,
   wherein forming of the first recess and the passivation layer comprises using a plasma mixture including chlorine ($Cl_2$) and nitrogen ($N_2$) gases as a main etching gas and a hydrogen ($H_2$) gas as an additional etching gas,
   wherein the second recess etching comprises using a gas mixture including HBr and $Cl_2$ gases and $SF_6$ and $O_2$ gases, and
   wherein the isotropical etching comprises using a gas mixture including HBr, $Cl_2$ and $O_2$ gases and a $NF_x$ or $CF_x$ gas.

2. The method as recited in claim 1, wherein forming of the first recess and the passivation layer is performed under a condition of a pressure ranging from approximately 5 mTorr to approximately 20 mTorr, a source power ranging from approximately 700 W to approximately 1,500 W and a bias power ranging from approximately 200 V to approximately 500 V with a Transformer Coupled Plasma (TCP) or Inductively Coupled Plasma (ICP) type plasma source.

3. The method as recited in claim 1, wherein the first recess has a depth ranging from approximately 1,000 Å to approximately 1,300 Å.

4. The method as recited in claim 1, wherein forming of the second recess is performed under a condition of a pressure ranging from approximately 10 mTorr to approximately 30 mTorr, a source power ranging from approximately 500 W to approximately 1,000 W, and a bias power ranging from approximately 100 V to approximately 500 V with a TCP or ICP type plasma source.

5. The method as recited in claim 1, wherein a flow ratio of HBr to $Cl_2$ to $SF_6$ to $O_2$ is approximately 9:3:13:1.

6. The method as recited in claim 5, wherein the second recess has a depth ranging from approximately 200 Å to approximately 500 Å.

7. The method as recited in claim 1, wherein the isotropical etching is performed under a condition of a pressure ranging from approximately 20 mTorr to approximately 100 mTorr, a source power ranging from approximately 500 W to approximately 1,500 W, and a bias power less than approximately 50 V with a TCP or ICP type plasma source.

8. The method as recited in claim 1, wherein the method further comprises, after forming of the first recess and the passivation layer, forming of an oxide layer on the passivation layer through a plasma oxidation process.

9. The method as recited in claim 8, wherein forming of the second recess is performed using the oxide layer and the passivation layer as an etch barrier.

10. The method as recited in claim 8, wherein the plasma oxidation process comprises using $N_2$ and $O_2$ gases.

11. The method as recited in claim 1, wherein forming of the first recess and forming of the second recess are performed in-situ in a high density etching apparatus.

12. The method as recited in claim 11, wherein forming of the first recess and forming of the second recess are performed in the high density etching apparatus using a TCP type, ICP type, microwave down stream (MDS) type, electron cyclotron resonance (ECR) type or helical type plasma source.

* * * * *